(12) United States Patent
Taki

(10) Patent No.: US 9,787,318 B2
(45) Date of Patent: Oct. 10, 2017

(54) SIGNAL CONTROL DEVICE

(71) Applicant: DENSO CORPORATION, Kariya, Aichi-pref. (JP)

(72) Inventor: Masaya Taki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/348,391

(22) Filed: Nov. 10, 2016

(65) Prior Publication Data
US 2017/0155400 A1   Jun. 1, 2017

(30) Foreign Application Priority Data

Nov. 26, 2015   (JP) ................................. 2015-230354

(51) Int. Cl.
| B62D 6/00 | (2006.01) |
| H03M 1/12 | (2006.01) |
| H02P 27/06 | (2006.01) |
| B62D 5/04 | (2006.01) |
| B62D 5/00 | (2006.01) |

(52) U.S. Cl.
CPC .......... H03M 1/1245 (2013.01); B62D 5/006 (2013.01); B62D 5/0463 (2013.01); H02P 27/06 (2013.01); H03M 1/1205 (2013.01)

(58) Field of Classification Search
CPC ...... H03M 1/1245; B62D 5/006; B62D 5/046
USPC ......................................................... 701/42
See application file for complete search history.

(56) References Cited

U.S. PATENT DOCUMENTS

| 2010/0019828 A1* | 1/2010 | Saito ................... H03K 17/002 327/404 |
| 2012/0176141 A1 | 7/2012 | Mikami et al. |
| 2013/0063290 A1* | 3/2013 | Zou ..................... H03M 1/1215 341/122 |
| 2016/0294539 A1 | 10/2016 | Kozawa et al. |

FOREIGN PATENT DOCUMENTS

| JP | 2012-145410 | * 8/2012 |
| JP | 2013-257816 A | 12/2013 |

* cited by examiner

*Primary Examiner* — Muhammad Shafi
(74) *Attorney, Agent, or Firm* — Knobbe, Martens, Olson & Bear, LLP

(57) ABSTRACT

A signal control device includes: a terminal of an input signal; a capacitor between the terminal and a reference potential; a charge/discharge circuit having a switch for switching connection between the charge/discharge circuit and the capacitor; an AD conversion circuit digitally converting an analog voltage in the capacitor; a switch control circuit controlling the switch and an AD conversion timing; a control arithmetic operation device performing a control arithmetic operation using an AD conversion value; and a malfunction determination device determining a terminal malfunction when the AD conversion value is not within a range. The AD conversion circuit performs: a charge/discharge AD conversion for converting the voltage in the capacitor when the charge/discharge circuit and the capacitor are connected; and an input AD conversion, at a different timing of the charge/discharge AD conversion, for converting the voltage in the capacitor when the charge/discharge circuit and the capacitor are disconnected.

15 Claims, 10 Drawing Sheets

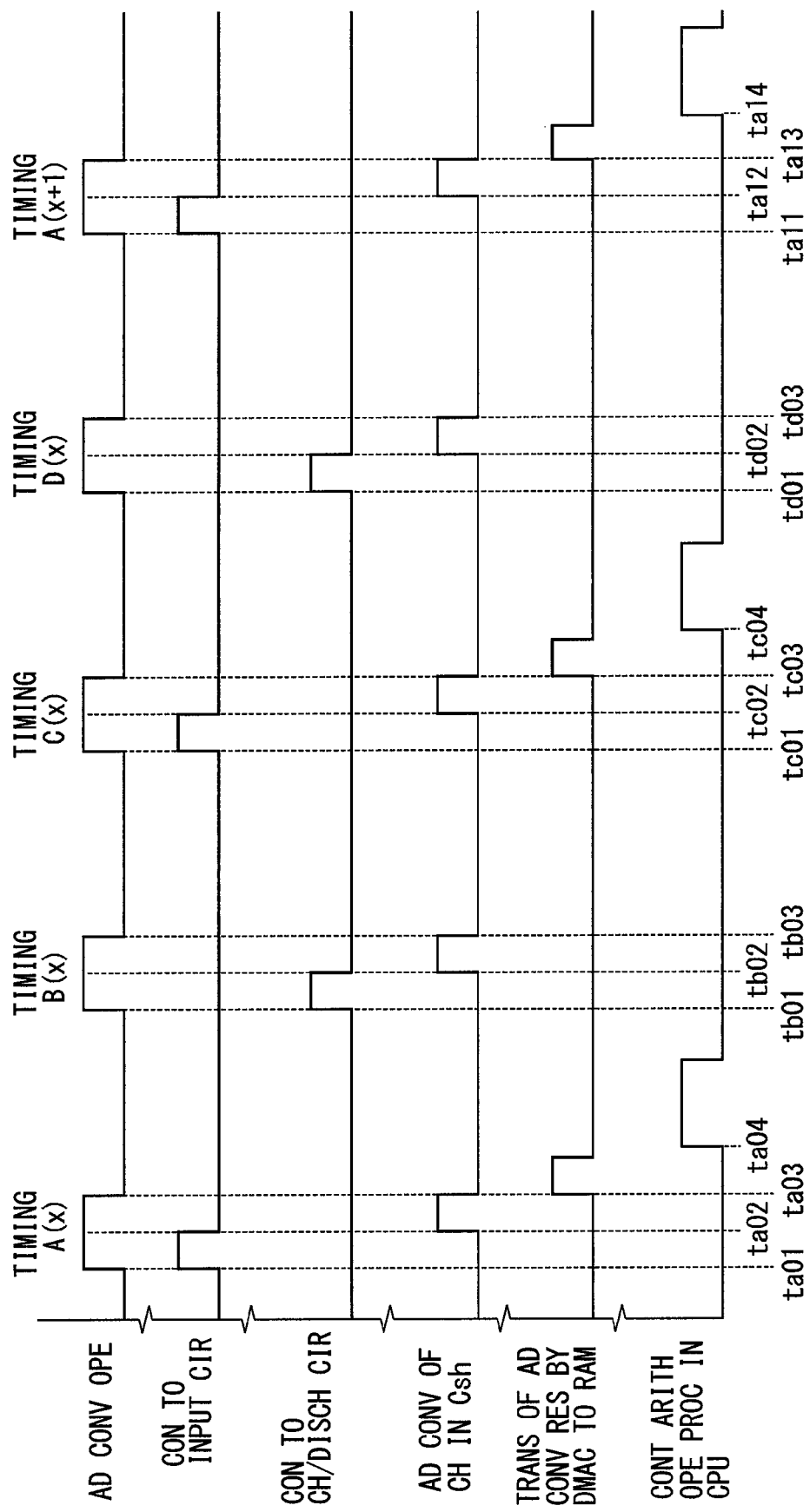

SIGNAL CONTROL DEVICE

CROSS REFERENCE TO RELATED APPLICATION

This application is based on Japanese Patent Application No. 2015-230354 filed on Nov. 26, 2015, the disclosure of which is incorporated herein by reference.

TECHNICAL FIELD

The present disclosure relates to a signal control device which AD-converts an input signal and performs a control arithmetic operation.

BACKGROUND

Conventionally, a technique has been known which detects a terminal malfunction such as abnormal opening of a signal input terminal or abnormal disconnection of a transmission path for an input signal in a signal control device which AD-converts an analog signal input thereto from a sensor and uses the resulting signal for a control arithmetic operation. For example, the signal input circuit disclosed in Patent Literature 1 includes a charge/discharge section which sets the both ends of an inspection capacitor to values within a fluctuation range. A determination processing section successively performs a charge/discharge procedure which cuts off an inspection path and then charges/discharges the inspection capacitor using the charge/discharge section and a conduction procedure which allows the inspection path to conduct electricity to detect a terminal malfunction.

In the technology in Patent Literature 1, an inspection-dedicated circuit including the inspection capacitor and the charge/discharge section is provided to be connectable or disconnectable to or from a signal line via an inspection switch. As can be presumed from the absence of a sampling capacitor which is charged with a voltage to be subjected to AD conversion in the drawing, it is intended to primarily implement a malfunction detection configuration without any consideration for relation to the AD conversion of an input signal.

When attention is focused on the relations among the respective ON/OFF timings of individual switches, in a 5 V/0 V charging process, a charge/discharge switch is operated to be turned ON/OFF in a state where each of the switch of a multiplexer and the inspection switch is OFF. On the other hand, in a malfunction detection process for an input-side resistor and an input-side capacitor, each of the switch of the multiplexer and the inspection switch is turned ON.

If the inspection switch is connected when the input signal is AD-converted, charge sharing occurs between the inspection capacitor and the sampling capacitor so that an erroneous voltage value different from the voltage value of the input signal is subjected to AD conversion. As a result, a control arithmetic operation using a correct AD conversion value cannot be performed. Even in the case where the inspection capacitor is not particularly provided, when AD conversion is performed in a state where a charge/discharge circuit is connected to the input signal, due to voltage division resulting from an input resistance and the resistance of the charge/discharge circuit, the AD conversion of the erroneous voltage value different from the intrinsic voltage value of the input signal is performed. Consequently, a control arithmetic operation using the correct AD conversion value cannot be performed. This presents a significant problem particularly in a system in which an extremely small error in input value affects steering feeling such as the electric power steering system of a vehicle.

Accordingly, in the technique in Patent Literature 1, it is necessary to independently operate the individual switches such that, when the input signal is AD-converted, the inspection switch is turned OFF and the switch of the multiplexer is turned ON, which results in a complicated switch control configuration. However, depending on a control configuration, it may also be difficult to, e.g., operate the charge/discharge switch independently of the timing of switching the multiplexer.

Also, in the technique in Patent Literature 1, a problem arises in that the inspection switch provided therein results in the need to give consideration to a failure mode in which the inspection switch is fixed in an ON or OFF state, which results in complicated malfunction detection logic.

[Patent Literature 1] JP-A-2012-145410

SUMMARY

It is an object of the present disclosure to provide a signal control device capable of detecting a terminal malfunction using a simple and easy switching operation.

According to an aspect of the present disclosure, a signal control device includes: at least one signal input terminal to which an input signal with a voltage fluctuating within a predetermined fluctuation range is input from an input circuit; a sampling capacitor having one end connected to the at least one signal input terminal and an other end connected to a reference potential; a charge or discharge circuit having a charge or discharge switch which switches electrical connection and electrical disconnection between the charge or discharge circuit and the sampling capacitor, and charges or discharges the sampling capacitor when the charge or discharge circuit and the sampling capacitor are connected to each other; an AD conversion circuit that converts an analog value of a voltage charged in the sampling capacitor to an AD conversion value; a switch control circuit that controls the charge or discharge switch, and adjusts a timing of AD conversion in the AD converter circuit when the charge or discharge switch switches the connection and disconnection; a control arithmetic operation device that performs a predetermined control arithmetic operation using at least a part of the AD conversion value in a result of the AD conversion of the AD conversion circuit; and a malfunction determination device that acquires the at least the part of the AD conversion value in the result of the AD conversion of the AD conversion circuit, and determines a terminal malfunction that the at least one signal input terminal or a transmission path of the input signal to be input into the at least one signal input terminal malfunctions when the at least the part of the AD conversion value is not within the predetermined fluctuation range. The AD conversion circuit performs a charge or discharge AD conversion in which the voltage charged in the sampling capacitor, in a state where the charge or discharge circuit and the sampling capacitor are electrically connected, and the input signal is input into the sampling capacitor via the at least one signal input terminal, is converted to an AD conversion value. The AD conversion circuit performs an input AD conversion in which the voltage charged in the sampling capacitor, in a state where the charge or discharge circuit and the sampling capacitor are electrically disconnected, but the input signal is input into the sampling capacitor via the at least one signal input terminal, is converted to an AD conversion value. The AD conversion circuit performs the charge or discharge AD conversion at a timing different from the input AD conversion.

In the above signal control device, upon each AD conversion, the input circuit and the sampling capacitor are connected through the charge/discharge AD conversion or the input AD conversion. On the other hand, the charge/discharge circuit and the sampling capacitor are connected through the charge/discharge AD conversion and are not connected through the input AD conversion. That is, in the operation of the present invention, it is sufficient to merely switch the charge/discharge circuit and the sampling capacitor between a connected state and a disconnected state upon each AD conversion in a state where conduction is provided between the input circuit and the sampling capacitor. In other words, there is no need for a switching operation which shifts the timing of connecting the input circuit and the sampling capacitor from the timing of connecting the charge/discharge circuit and the sampling capacitor. This allows a terminal malfunction to be detected using a simple and easy switching operation.

The control arithmetic operation section also performs a predetermined control arithmetic operation using any of AD conversion values included in a result of the AD conversion by the AD conversion circuit. Preferably, the control arithmetic operation section uses only the AD conversion value resulting from the input AD conversion and does not use only the AD conversion value resulting from the charge/discharge AD conversion. This allows the control arithmetic operation using a correct AD conversion value to be performed.

Thus, the present invention is particularly effective in a system in which an extremely small error in input value affects steering feeling such as an electric power steering system of a vehicle.

BRIEF DESCRIPTION OF THE DRAWINGS

The above and other objects, features and advantages of the present disclosure will become more apparent from the following detailed description made with reference to the accompanying drawings. In the drawings:

FIG. 10 is a time chart showing an operation of a signal control device in a comparative example.

DETAILED DESCRIPTION

Common System Configuration

Figure 1:
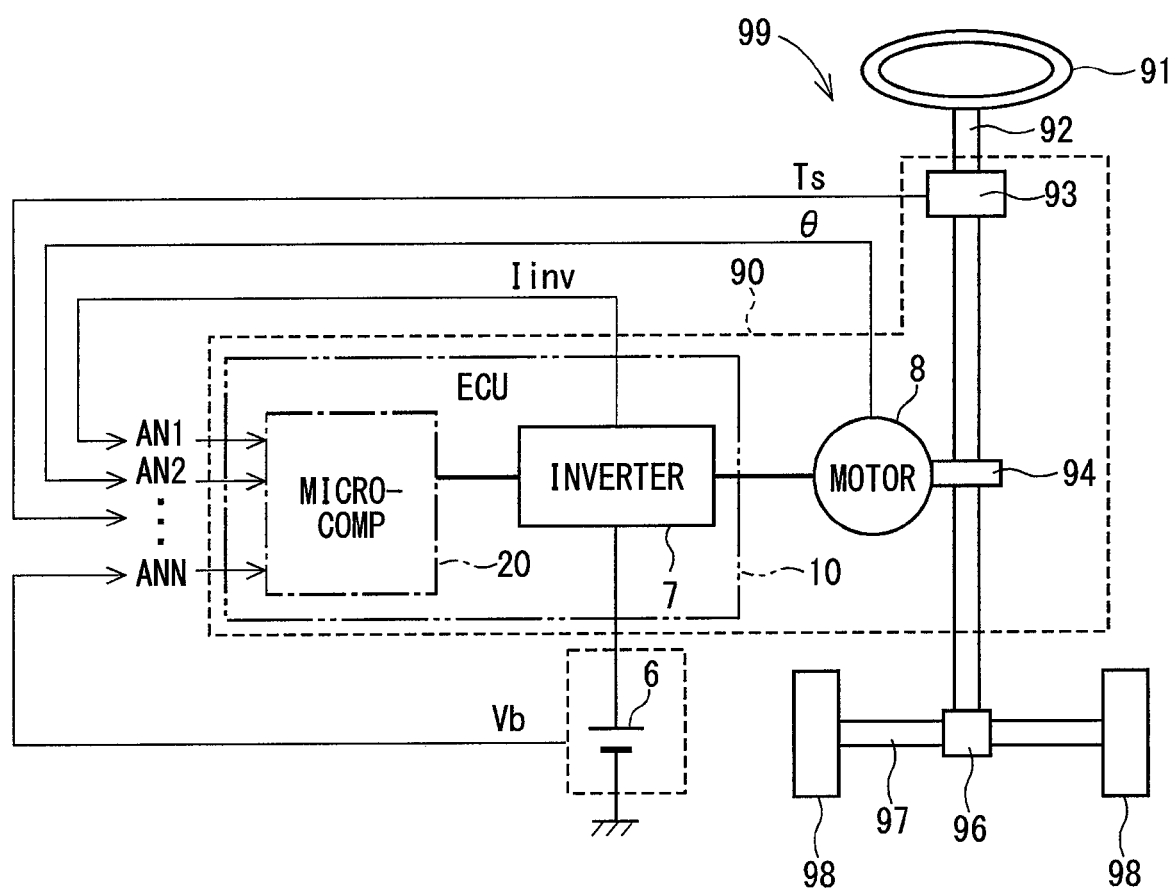
FIG. 1 is a schematic configuration diagram of an electric power steering system to which a signal control device in each of embodiments is applied.

Referring first to FIG. 1, a schematic configuration of an electric power steering system to which a signal control device in each of embodiments is commonly applied will be described.

An electric power steering system 90 is a system which assists a steering torque of a driver with an output torque of an assist motor 8. Note that the electric power steering system 90 shown in FIG. 1 is of a column assist type, but is similarly applicable also to an electric power steering system of a rack assist type.

A steering system 99 includes a steering wheel 91, a steering shaft 92, a pinion gear 96, a rack shaft 97, wheels 98, the electric power steering system 90, and the like.

To the steering wheel 91, the steering shaft 92 is connected. The pinion gear 96 provided at the end of the steering shaft 92 meshes with the rack shaft 97. The rack shaft 97 has the pair of wheels 98 provided at the both ends thereof via a tie rod. When the driver rotates the steering wheel 91, the steering shaft 92 connected to the steering wheel 91 rotates. The rotational movement of the steering shaft 92 is converted by the pinion gear 96 to the linear movement of the rack shaft 97 so that the pair of wheels 98 are steered to angles in accordance with the displacement of the rack shaft 97.

The electric power steering system 90 includes an assist motor 8, an ECU 10, a torque sensor 93, a deceleration gear 94, and the like.

The assist motor 8 is, e.g., a 3-phase ac brushless motor. A rotation angle $\theta$ of the assist motor 8 is detected by a rotation angle sensor not shown.

The torque sensor 93 is provided in the middle of the steering shaft 92 to detect a steering torque Ts.

The ECU 10 as a "signal control device" includes a microcomputer 20, an inverter 7, and the like.

The inverter 7 converts a dc power from a battery 6 to an ac power on the basis of an output instruction from the microcomputer 20 and supplies the ac power to the assist motor 8. An inverter current Iinv output from the inverter 7 is detected by a current sensor not shown.

Information on the inverter current Iinv and the rotation angle 8 is used as a feedback signal for controlling an output of the assist motor 8 in the microcomputer 20.

The microcomputer 20 of the ECU 10 acquires information on the steering torque Ts, the inverter current Iinv, the rotation angle 8, a battery voltage Vb, and the like basically as analog signals each representing a voltage value. In the present embodiment, it is unnecessary to distinguish individual input signals according to the types thereof so that various analog input signals are generally denoted by "AN1, AN2, . . . and ANN". For example, to a configuration in which individual sensors are redundantly provided from a fail-safe standpoint, a plurality of signals of the same type may also be input. It may also be possible to acquire some of the inputs using another device such as by digital communication without acquiring all the inputs as the analog signals.

Here, the "1, 2, . . . and N" in the respective third positions of the "AN1, AN2, . . . and ANN" from the left are the numbers successively assigned to N input signals. Hereinbelow, the present specification will use the same notation also for the reference numerals of a plurality of other components provided correspondingly to the plurality of input signals. Note that each of the embodiments primarily assumes a case where N is a plural number. However, it is also possible to assume a case where only one input signal is input to the ECU 10.

The microcomputer 20 arithmetically determines an amount of assist output from the assist motor 8 through a control arithmetic operation based on each of the input signals AN1, AN2, . . . and ANN and outputs a drive signal corresponding thereto to the inverter 7. Thus, the power supplied to the assist motor 8 is controlled such that the assist motor 8 outputs a torque in accordance with the required amount of assist. The assist torque generated from the assist motor 8 is transmitted to the steering shaft 92 via the deceleration gear 94.

Note that each of the processes in the ECU 10 may be a software process which is implemented through the execution of a program stored in advance by the CPU or may also be a hardware process implemented by a dedicated electronic circuit. It may also be possible to integrally configure the ECU 10 and the assist motor 8.

Next, a description will be given successively of the respective configurations of the ECUs 10 in the first to third embodiments, with emphasis on those of the microcomputers 20 included in the ECUs 10 and the AD converters in the microcomputers 20. In the following description of the individual embodiments, to distinguish the ECUs 10 and the microcomputers 20 in the first to third embodiments from each other, the reference numerals of the ECUs 10 and the microcomputers 20 in the first to third embodiments have additional numbers corresponding to the first to third embodiments at the third positions thereof from the left. For example, the reference numeral of the ECU in the first embodiment is "101". Likewise, the general reference numerals of the CPUs and the AD converters in the microcomputers 20 are "30" and "40" and have additional numbers corresponding to the first to third embodiments at the third positions thereof from the left to distinguish the CPUs and the AD converters in the first to third embodiments from each other.

First Embodiment

Figure 2:
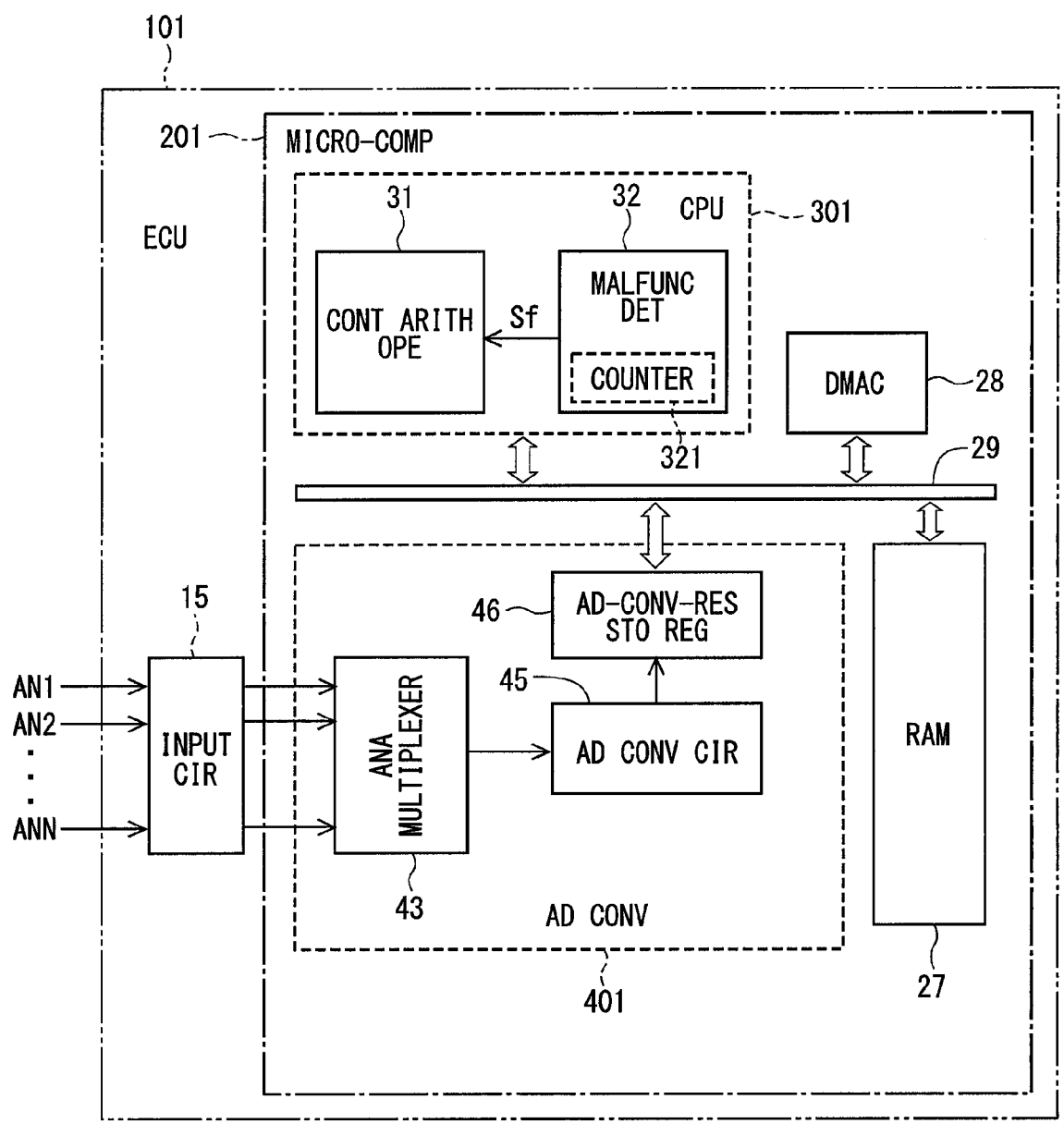
FIG. 2 is a configuration diagram of the signal control device in each of the first and second embodiments.

Referring to FIG. 2, a description will be given of a configuration of the ECU 101 and a microcomputer 201 in the first embodiment. Note that, in the following description of the configuration of the ECU, the inverter 7 is omitted.

The microcomputer 201 includes an AD converter 401, a CPU 301, a RAM 27, a DMAC 28, and the like which can communicate information with each other via a bus 29.

The first embodiment assumes a configuration in which the plurality of input signals AN1, AN2, . . . and ANN are input to the microcomputer 201.

The AD converter 401 includes an analog multiplexer 43, an AD conversion circuit 45, an AD-conversion-result storage register 46, and the like. Among the plurality of input signals AN1, AN2, . . . , and ANN input from an external sensor to the input circuit 15 of the ECU 101, the signal uniquely selected by the analog multiplexer 43 is AD-converted in the AD conversion circuit 45. The result of the AD conversion by the AD conversion circuit 45 is stored in the AD-conversion-result storage register 46.

A specific configuration of the AD converter 401 will be described later with reference to FIG. 3.

The CPU 301 in the first embodiment includes a control arithmetic operation section 31 and a malfunction determination section 32.

The control arithmetic operation section 31 performs a predetermined control arithmetic operation using at least any of AD conversion values included in the result of the AD conversion by the AD conversion circuit 45 of the AD converter 401. In the present embodiment applied to the electric power steering system 90, the control arithmetic operation section 31 arithmetically determines the amount of assist of the assist motor 8 on the basis of the AD conversion values of the input signals AN1, AN2, . . . , and ANN representing the steering torque Ts, the inverter current Iinv, the motor rotation angle θ, the battery voltage Vb, and the like.

The malfunction determination section 32 acquires at least any of the AD conversion values included in the result of the AD conversion by the AD conversion circuit 45. When the acquired AD conversion value is outside a predetermined fluctuation range, the malfunction determination section 32 determines that there is a "terminal malfunction" described later. Specifically, the malfunction determination section 32 has a malfunction determination counter 321 and determines that a terminal malfunction has occurred when the count value of the malfunction determination counter 321 is not less than a predetermined threshold value.

The AD conversion value used herein by the control arithmetic operation section 31 for the control arithmetic operation or by the malfunction determination section 32 for malfunction determination is the AD conversion value resulting from "input AD conversion" described later. "at least any of the AD conversion values" means the input AD conversion value.

The RAM 27 stores the result of an arithmetic operation by the CPU 301 and the like.

The DMAC (i.e., Direct Memory Access Controller) 28 operates independently of the CPU 301 and transfers the AD conversion values stored in the AD-conversion-result storage register 46 to the RAM 27. Next, a description will be given of a configuration of the AD converter 401 in the first embodiment with reference to FIG. 3.

To the AD converter 401 in the first embodiment, the plurality of input signals AN1, AN2, . . . , and ANN having voltage values which fluctuate within the predetermined fluctuation range are input.

Accordingly, a plurality of configurations corresponding to the individual input signals are provided. In FIG. 3, "1, 2, . . . , and N" are shown at the ends of numerical or alphabetical reference marks denoting a plurality of components. As for common items, they are collectively shown using reference marks without the last "1, 2, . . . , and N". As necessary, each of the components has the word "N-th" added to the head thereof.

In the ECU 101, to input circuits 151, 152, . . . and 15N provided outside the AD converter 401, signals from individual external sensors are input via external input terminals 141, 142, . . . , and 14N. Input resistors Rin1, Rin2, . . . , and RinN are connected between the input circuits 151, 152, . . . , and 15N and signal input terminals Tin1, Tin2, . . . , and Tin of the AD converter 401.

Input-side capacitors Cin1, Cin2, . . . , and CinN are provided between the signal input terminals Tin1, Tin2, . . . , and TinN and a reference potential on the side of the AD converter 401 which is closer to the input circuits 151, 152, . . . , and 15N to suppress fluctuations in input voltages. It is preferable that, to appropriately suppress fluctuations in input voltages, the capacitances of the input-side capacitors Cin are normally larger than the capacitance of a sampling capacitor Csh of the AD converter 401. However, depending on the characteristics of the input signals, it is not limited thereto. A configuration may also be such that the input-side capacitors Cin are not provided.

The AD converter 401 includes the signal input terminals Tin, the sampling capacitor Csh, transmission paths 41, charge/discharge circuits 42, the analog multiplexer 43, the AD conversion circuit 45, the AD-conversion-result storage register 46, a switch control circuit 47, and the like.

To the signal input terminals Tin1, Tin2, . . . , and TinN, the input signals AN1, AN2, . . . , and ANN are input from the corresponding input circuits 151, 152, . . . , and 15N. The input signals AN1, AN2, . . . , and ANN are transmitted to the sampling capacitor Csh via transmission paths 411, 412, . . . , and 41N and the analog multiplexer 43.

Between the signal input terminals Tin1, Tin2, . . . , and TinN and the reference potential, floating capacitances (or parasitic capacitances) Cfl1, Cfl2, . . . , and CflN are generated.

The sampling capacitor Csh has one end connected to the signal input terminals Tin via the analog multiplexer 43 and the transmission paths 41 and the other end connected to the reference potential.

The analog multiplexer 43 uniquely selects any of the plurality of signal input terminals Tin and connects the selected signal input terminal to the sampling capacitor Csh. In the present embodiment, the analog multiplexer 43 need not necessarily have a "full power-OFF mode" in which the sampling capacitor Csh is connected to none of the signal input terminals Tin.

The AD conversion circuit 45 digitally converts the value of the analog voltage with which the sampling capacitor Csh is charged.

The AD-conversion-result storage register 46 stores the result of the AD conversion by the AD conversion circuit 45. The result of the AD conversion stored in the AD-conversion-result storage register 46 is transferred to the RAM 27 and the CPU 301 via the bus 29.

The switch control circuit 47 operates a charge switch SWc of the charge/discharge circuit 42, a discharge switch SWd thereof, and the switch of the analog multiplexer 43. The switch control circuit 47 also controls the timing of the AD conversion by the AD conversion circuit 45 upon switching of the charge switch SWc or the discharge switch SWd. The control of the AD conversion timing may also be performed on the basis of an instruction from the outside.

An open failure in any of the signal input terminals Tin or a disconnection failure in any of the transmission paths 41 are each defined herein as a "terminal malfunction". To be exact, the disconnection failure in any of the transmission path 41 means a disconnection failure in the transmission path 41 between the signal input terminal Tin and the branch point to the charge/discharge circuit 42.

A description will be given of the problem encountered at the occurrence of a terminal malfunction using the path for the input signal from the first input circuit 151.

If an open failure occurs at the first signal input terminal Tin1, the AD conversion circuit 45 undesirably AD-converts the voltage with which the floating capacitance Cfl1 is charged with the timing with which the AD conversion circuit 45 should normally AD-convert the voltage of the first input circuit 151. Under a normal condition, the voltage of the floating capacitance Cfl1 is substantially equal to the input voltage from the first input circuit 151. However, when a disconnection occurs in the transmission path 411, the charges stored in the floating capacitance Cfl1 immediately before are held therein and gradually lost in the form of a leakage current or the like by natural discharge when nothing is performed.

However, when the first signal input terminal Tin1 is connected to the sampling capacitor Csh with the timing of the AD conversion after the disconnection, the sharing of the charges from the sampling capacitor Csh occurs. As a result, in the configuration of the AD converter 401 which performs conversion using the same sampling capacitor Csh, while switching the plurality of signal input terminals Tin from one to another using the multiplexer 43, the floating capacitance Cfl1 is not always fully discharged.

As a result, in this case, the presence or absence of a disconnection failure in the transmission path 411 cannot correctly be determined only from the result of the AD conversion. When the control arithmetic operation section 31 of the CPU 301 continues control using an erroneous AD conversion result, in the electric power steering system 90, an inappropriate assist force may be generated.

Accordingly, in the first embodiment, to the transmission paths 41 for the individual input signals AN, the charge/discharge circuits 42 for positively charging/discharging the floating capacitances Cfl are connected. FIG. 3 shows a specific configuration of the first charge/discharge circuit 421. Each of the other charge/discharge circuits 422, . . . , and 42N has the same configuration.

Each of the charge/discharge circuits 42 includes the charge switch SWc and the discharge switch SWd. The charge switch SWc is connected between a connection point J connected to the transmission path 41 and a charge power source potential Vp (e.g., 5 V) via a resistor Rc. The discharge switch SWd is connected between the connection point J and a reference potential Vss (e.g., 0 V) via a resistor Rd.

When the charge switch SWc is connected, the sampling capacitor Csh is charged with the voltage of the charge power supply potential Vp. On the other hand, when the discharge switch SWd is connected, the charges stored in the sampling capacitor Csh are released to the reference potential Vss. When neither the charge switch SWc nor the discharge switch SWd is connected, the conduction between the charge/discharge circuit 42 and the sampling capacitor Csh is interrupted.

By thus operating the charge switch SWc and the discharge switch SWd, it is possible to provide conduction between the charge/discharge circuit 42 and the sampling capacitor Csh or interrupt the conduction therebetween. It is also possible to charge or discharge the sampling capacitor Csh when conduction is provided between the charge/discharge circuit 42 and the sampling capacitor Csh.

Unless a disconnection failure has occurred in any of the transmission paths 41, when the charge switch SWc or the discharge switch SWd is connected, the floating capacitance Cfl generated between each of the transmission paths 41 and the reference potential is also charged or discharged.

Unless an open failure has occurred in any of the signal input terminals Tin, when the charge switch SWc or the discharge switch SWd is connected, the input-side capacitor Cin connected between each of the signal input terminals Tin and the reference potential is also charged or discharged.

A case where an open failure occurs in the first signal input terminal Tin1 is assumed herein.

The voltage of the floating capacitance Cfl1 is equal to the voltage of the first input circuit 151 under the normal condition. However, when an open failure occurs in the first signal input terminal Tin1, the charges stored in the floating capacitance Cfl1 are held therein irrespective of the voltage of the first input circuit 151. When nothing is performed, natural discharge occurs in the form of a leakage current or the like. However, when the first signal input terminal Tin1 is connected to the sampling capacitor Csh with the timing of the AD conversion, the sharing of the charges from the sampling capacitor Csh occurs so that the floating capacitance Cfl is not always fully discharged.

Accordingly, a configuration is used in which conduction is provided not only between the sampling capacitor Csh and the floating capacitance Cfl1, but also between the charge/discharge circuit 421 and the floating capacitance Cfl1. For example, by connecting the discharge switch SWd, it is possible to remove charges from the floating capacitance Cfl1 without depending on natural discharge. Also, by connecting the charge switch SWc, it is possible to store charges in the floating capacitance Cfl1.

As a result, by performing circuit design such that, e.g., the voltage of the input signal AN1 under the normal condition does not include the reference voltage, the malfunction determination section 32 can determine the occurrence of an open failure on the basis of the AD conversion result. Therefore, it is possible to prevent the control arithmetic operation section 31 from performing the control arithmetic operation using an erroneous AD conversion value.

A technique which detects a terminal malfunction using a charge/discharge circuit in an AD converter is disclosed in Patent Literature 1 (JP-A-2012-145410). However, in the prior art technique in Patent Literature 1, an inspection-dedicated circuit which includes an inspection capacitor and a charge/discharge section is provided to be connectable or disconnectable to or from a signal line via an inspection switch.

If the inspection switch is connected when an input signal is AD-converted, charge sharing occurs between the inspection capacitor and a sampling capacitor so that an erroneous voltage value different from the voltage value of the input signal is subjected to AD conversion. As a result, the control arithmetic operation using a correct AD conversion value cannot be performed. This presents a significant problem particularly in a system in which an extremely small error in input value affects steering feeling such as an electric power steering system of a vehicle.

Accordingly, in the technique in Patent Literature 1, it is necessary to independently operate the individual switches, which results in a complicated switch control configuration. In addition, in the technique in Patent Literature 1, the inspection switch is provided so that the need arises to give consideration also to a failure mode in which the inspection switch is fixed in an ON or OFF state. This causes the problem of complicated malfunction detection logic.

A description will be given of a configuration of the AD converter 401 in FIG. 3 as a replacement for the configuration in the prior art technique. In the case the wording "connection with the input circuit 15" or "connection with the charge/discharge circuit 42" is just mentioned, the wording means the connection between the sampling capacitor Csh and the input circuit 15 or the connection between the sampling capacitor Csh and the charge/discharge circuit 42. The same applies also to the case where the wording "connection to the input circuit 15" or "connection to the charge/discharge circuit 42" is mentioned. The wording "connected to the charge/discharge circuit 42" means that either the charge switch SWc or the discharge switch SWd is connected.

It is logically possible to AD-convert a correct voltage value upon connection to the input circuit 15 by preventing the simultaneous occurrence of connection to the charge/discharge circuit 42 and connection to the input circuit 15. However, in an actual situation, there is a microcomputer which does not have the function of shifting the timing of connection to the charge/discharge circuit 42 from the timing of connection to the input circuit 15.

Figure 3:
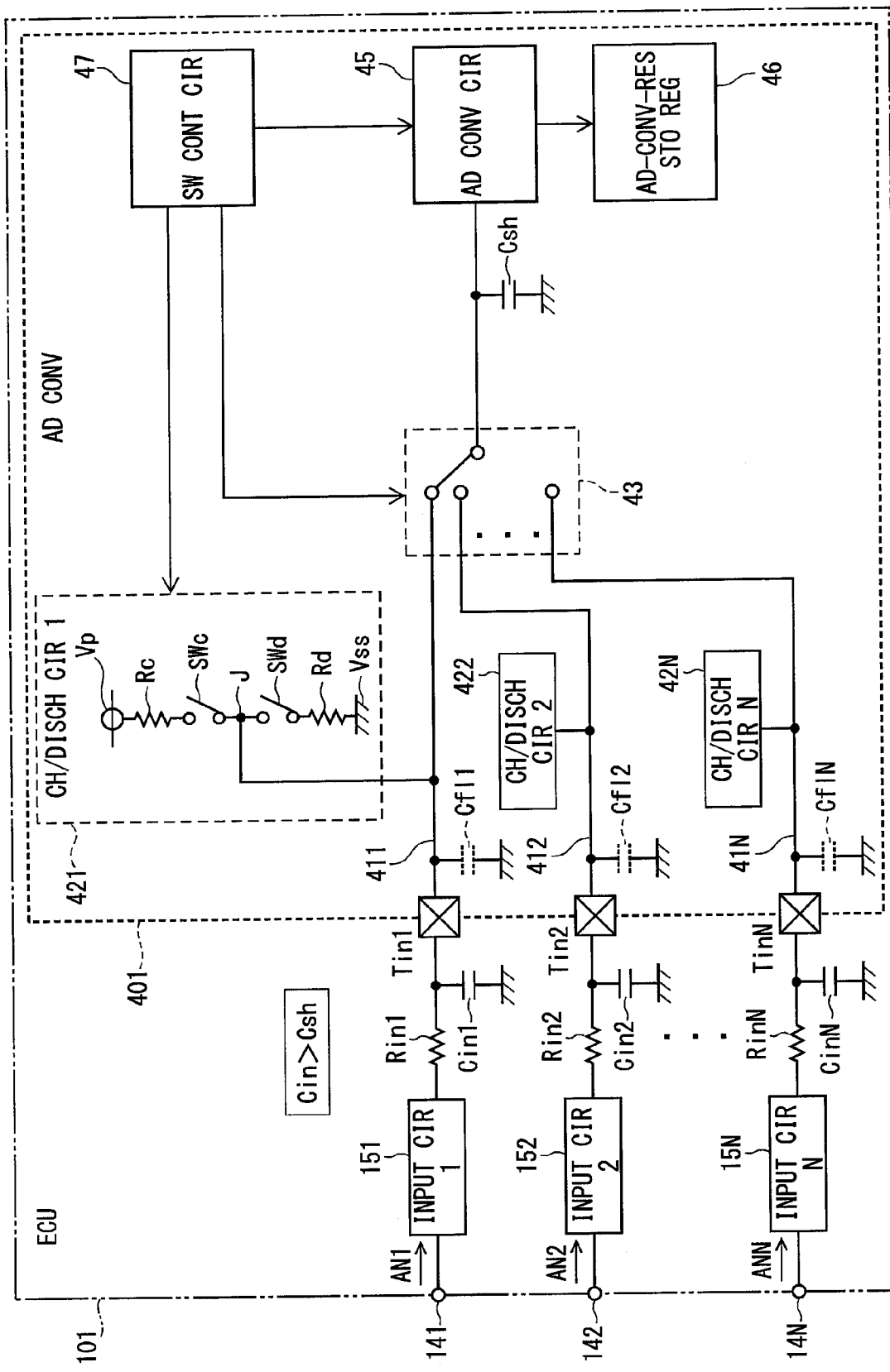
FIG. 3 is a configuration diagram of an AD converter in the signal control device in the first embodiment.

In view of such a problem, in the first embodiment, not only the configuration of the AD converter 401 in FIG. 3, but also the procedure of a switching operation performed by the switch control circuit 47 has a characteristic feature. An object of the first embodiment is to allow a terminal malfunction to be detected using a simple and easy switching operation by performing the characteristic operation even when a microcomputer which does not have the function of shifting the timing of connecting the charge/discharge circuit 42 from the timing of connecting the input circuit 15 is used.

Next, referring to the time charts in FIGS. 4 to 6, a description will be given of an example of the operation of the ECU 101.

Figure 4:
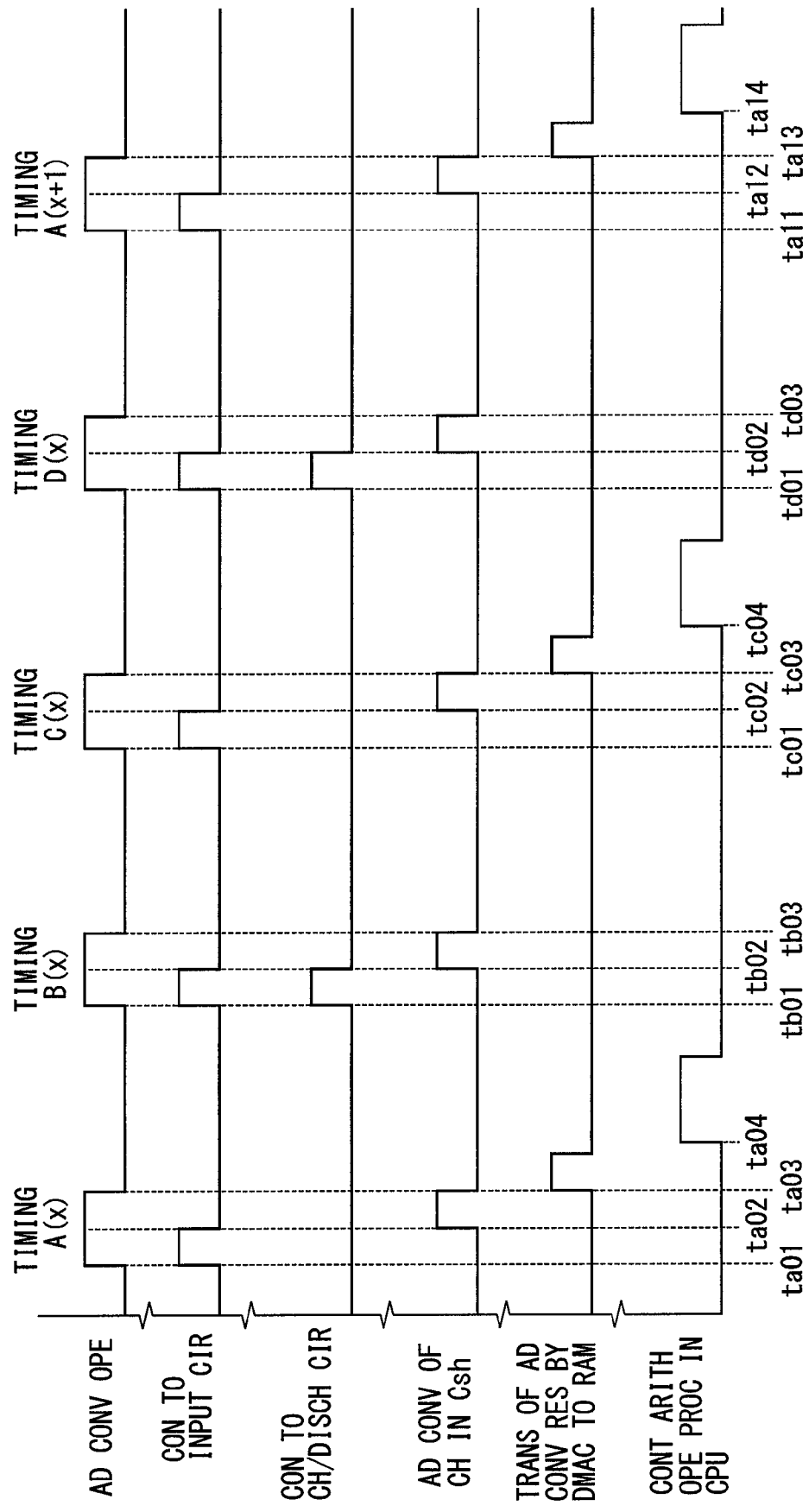
FIG. 4 is a time chart showing Operation Example 1 of the signal control device in the first embodiment.
Figure 5:
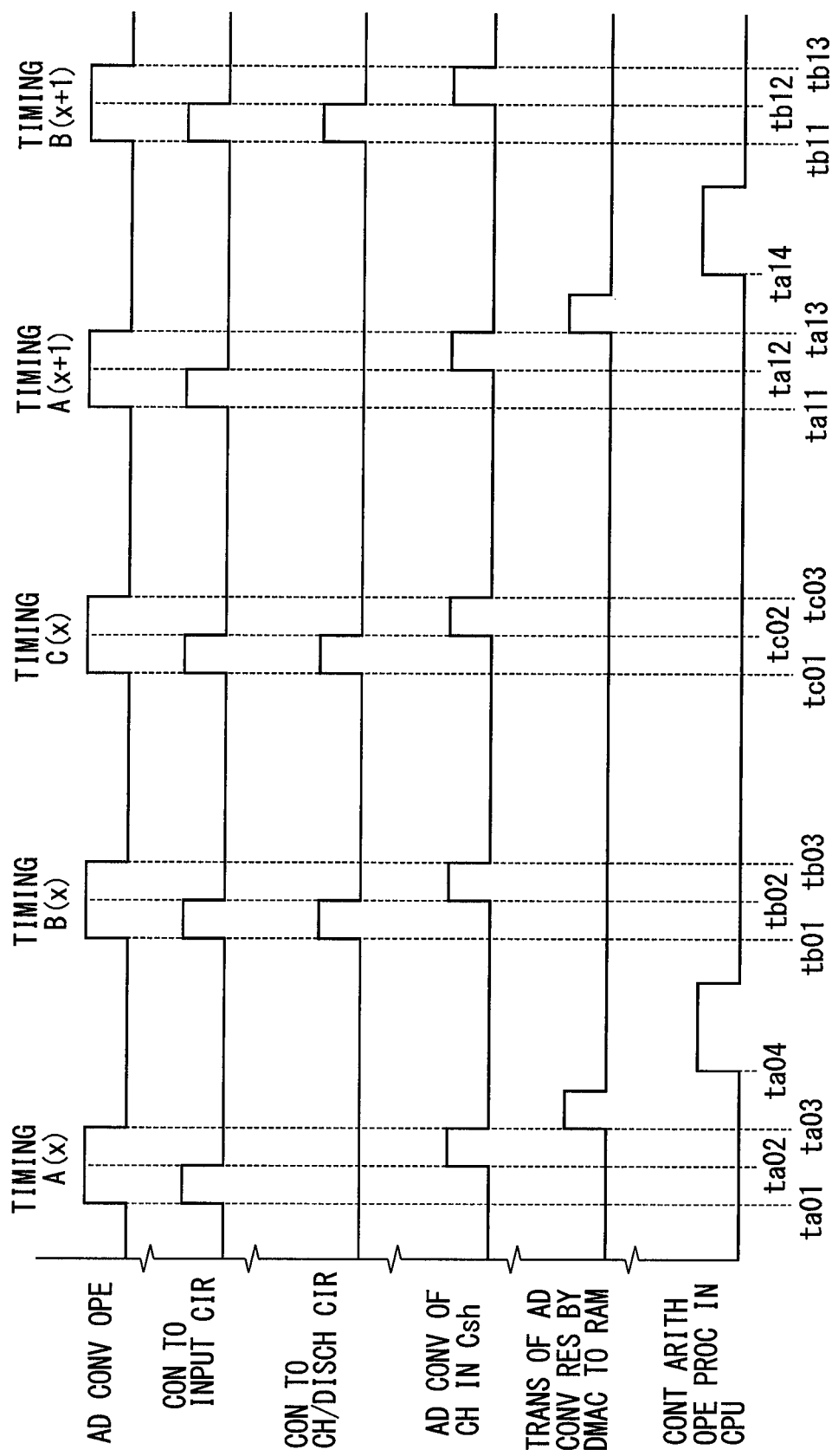
FIG. 5 is a time chart showing Operation Example 2 of the signal control device in the first embodiment.

Each of FIGS. 4 and 5 shows the individual timings of an AD conversion operation, connection to the input circuit 15, connection to the charge/discharge circuit 42, the AD conversion of charges stored in the sampling capacitor Csh, the transfer of the AD conversion result by the DMAC 28 to the RAM, and the control arithmetic operation process in the CPU 301 in descending order.

In "Operation Example 1" shown in FIG. 4, four AD conversion timings which are timings A, B, C, and D are periodically repeated. For example, "timing A(x)" shows the x-th timing A. A time ta01 at the x-th timing A(x) or the like and a time ta11 at the (x+1)-th timing A(x+1) or the like correspond to each other. The "time" written in the time ta01 or the like is omitted hereinafter.

At the timing A(x), for a period from ta01 to ta02, the sampling capacitor Csh is connected to the input circuit 15 and is not connected to the charge/discharge circuit 42. For a period from ta02 to ta03, the charges stored in the sampling capacitor Csh are subjected to AD conversion.

The operation of thus AD-converting the value of the voltage of the input signal with which the sampling capacitor Csh is charged in a state where the conduction between the charge/discharge circuit 42 and the sampling capacitor Csh is interrupted is referred to as the "input AD conversion". The result of the input AD conversion is DMA-transferred at ta03 or later and used for a control arithmetic operation at ta04 or later.

At the timing B(x), for a period from tb01 to tb02, the sampling capacitor Csh is connected to the input circuit 15 and the charge/discharge circuit 42. For a period from tb02 to tb03, the charges stored in the sampling capacitor Csh are subjected to AD conversion.

The operation of thus AD-converting the value of the voltage of the input signal with which the sampling capacitor Csh is charged in a state where conduction is provided between the charge/discharge circuit 42 and the sampling capacitor Csh is referred to as the "charge/discharge AD conversion". The result of the charge/discharge AD conversion is neither DMA-transferred nor used for the control arithmetic operation.

At the timing C, the input AD conversion is performed in the same manner as at the timing A. At the timing D, the charge/discharge AD conversion is performed in the same manner as at the timing B.

An operation in a comparative example is shown in FIG. 10. In the operation in the comparative example, connection to the input circuit 15 is not provided when connection to the charge/discharge circuit 42 is provided at the timings B and C. In this configuration, it is necessary for the switch control circuit 47 to have the function of controlling the timings such that the timing of connection to the charge/discharge circuit 42 is not coincident with the timing of connection to the input circuit 15.

By contrast, in the present embodiment, connection to the input circuit 15 is provided upon each AD conversion and the input AD conversion in a state where connection to the charge/discharge circuit 42 is not provided and the charge/discharge AD conversion in a state where connection to the charge/discharge circuit 42 is provided are performed with different timings. That is, it is sufficient for the switch control circuit 47 to control only the presence or absence of connection to the charge/discharge circuit 42 upon each AD conversion. Accordingly, even in a configuration in which the microcomputer 201 does not have the function of setting the timing of connection to the charge/discharge circuit 42 and the timing of connection to the input circuit 15 such that the timings are shifted from each other, it is possible to detect a terminal malfunction using a simple and easy switching operation.

In addition, by properly selecting only the AD conversion value resulting from conversion performed with the timing of the input AD conversion at each of the timings A and C and causing the control arithmetic operation section 31 to acquire the selected AD conversion value, it is possible to perform a control arithmetic operation using only the correct AD conversion value.

In Operation Example 1 in FIG. 4, switching is alternately performed between the input AD conversion and the charge/discharge AD conversion. However, in a configuration in which the capacitances of the input-side capacitors Cin are larger than the capacitance of the sampling capacitor Csh in the AD converter 402 and the floating capacitances Cfl, by increasing the number of times connection to the charge/discharge circuit 42 is provided within a predetermined period, it is possible to ensure a long charge/discharge period.

In "Operation Example 2" shown in FIG. 5, three AD conversion timings A, B, and C are periodically repeated. At the timing A among the three timings, the input AD conversion is performed. At each of the timings B and C among the three timings, the charge/discharge AD conversion is performed. That is, while the AD conversion value is used once for the control arithmetic operation, charging/discharging is performed twice. The behavior at each of times including ta01 and the times subsequent thereto is the same as in FIG. 4 so that a description thereof is omitted. Thus, the number of times the AD conversion circuit 45 performs the input AD conversion may also be different from the number of times the AD conversion circuit 45 performs the charge/discharge AD conversion.

In a configuration which performs the DMA transfer using the DMAC 28, in Operation Example 2, the DMA transfer may appropriately be performed once when the AD conversion is performed three times. During the DMA transfer, data being transferred occupies the bus 29 so that an access to the RAM in the CPU 301 is caused to wait in most cases. Accordingly, by DMA-transferring only the AD conversion value resulting from the input AD conversion, it is possible to minimize the number of times the DAM transfer is performed and reduce the wait time in the CPU 301.

Note that, when a malfunction occurs in any of the transmission paths 41 for the input signals AN, the AD conversion value resulting from conversion performed at the timing A due to the sharing of charges from the floating capacitance Cfl charged/discharged at the timings B and C or from the input-side capacitor Cin is also outside the fluctuation range. Accordingly, by monitoring the value resulting from the conversion performed at the timing A and DMA-transferred, the malfunction determination section 32 of the CPU 301 can determine a terminal malfunction.

In general, to perform the AD conversion when connection to the charge/discharge circuit 42 is provided and the AD conversion when connection to the charge/discharge circuit 42 is not provided with different timings, a larger number of AD-conversion-timing generation device, specifically a larger number of timer triggers, are required accordingly.

In view of this, a case is assumed where a microcomputer which allows connection to the plurality of signal input terminals Tin to be arbitrarily set and allows AD conversion to be performed on the basis of a plurality of set information items is used.

It is assumed that, among four signal input terminals i to iv shown in Table 1, the two signal input terminals i and ii are assigned to a "first group" and the two signal input terminals iii and iv are assigned to a "second group". This technical idea will be generalized as follows. That is, each of the first and second groups includes one or more signal input terminals. The second group is a group of at least one or more signal input terminals different from the signal input terminals included in the first group. Even when three or more groups are provided also, at least two groups are required to have characteristic features shown below.

Note that, in the table, a "group" is represented as "Gr".

TABLE 1

| | AD Conversion Timing Generation Device | Signal Input Terminals | Coupling to Charge/ Discharge Circuit | DMA Transfer |
|---|---|---|---|---|
| Timing 1 | Timer Trigger A | i, ii (1st Gr) | Absent | Present |
| Timing 2 | Timer Trigger B | iii, iv (2nd Gr) | Absent | Present |
| Timing 3 | Timer Trigger C | i, ii (1st Gr) | Present | Absent |
| Timing 4 | Timer Trigger D | iii, iv (2nd Gr) | Present | Absent |

When connection to the charge/discharge circuit 42 is not provided, the input signals input to the individual signal input terminals i and ii in the first group are subjected to the input AD conversion with timings generated using a timer trigger A as one and the same AD conversion trigger. On the other hand, the input signals input to the individual signal input terminals iii and iv in the second group are subjected to the input AD conversion with timings generated using a timer trigger B as one and the same AD conversion trigger different from the timer trigger A for the first group. The resulting input AD conversion values are DMA-transferred.

In the configuration in Table 1, even when connection to the charge/discharge circuit 42 is provided also, the input signals input to the individual signal input terminals i and ii in the first group are subjected to the charge/discharge AD conversion with timings generated using a timer trigger C as one and the same AD conversion trigger. On the other hand, the input signals input to the individual signal input terminals iii and iv in the second group are subjected to the charge/discharge AD conversion with timings generated using a timer trigger D as one and the same AD conversion trigger different from the timer trigger C for the first group. The resulting charge/discharge AD conversion values are not DMA-transferred.

Thus, in the configuration in Table 1, four timer triggers in total are required. By contrast, a configuration which allows a reduction in the number of timer triggers is shown in Table 2.

TABLE 2

| | AD Conversion Timing Generation Device | Signal Input Terminals | Coupling to Charge/Discharge Circuit | DMA Transfer |
|---|---|---|---|---|
| Timing 1 | Timer Trigger A | i, ii (1st Gr) | Absent | Present |
| Timing 2 | Timer Trigger B | iii, iv (2nd Gr) | Absent | Present |
| Timing 3 | Timer Trigger C | i, ii (1st Gr) iii, iv (2nd Gr) | Present | Absent |

The configuration at Timings 1 and 2 in Table 2, i.e., the configuration when connection to the charge/discharge circuit 42 is not provided is the same as in Table 1. On the other hand, the configuration at Timings 3 and 4 in Table 1, i.e., the configuration when connection to the charge/discharge circuit 42 is provided is included in one "Timing 3" in Table 2. That is, the input signals input to the individual signal input terminals i and ii in the first group and the input signals input to the individual signal input terminals iii and iv in the second group are subjected to the charge/discharge AD conversion with timings generated using the timer trigger C as the common AD conversion trigger. The resulting charge/discharge AD conversion values are not DMA-transferred. The configuration in Table 2 allows a reduction in the number of the timer triggers from 4 to 3.

Thus, in the configuration in Table 2, the AD-conversion-timing generation device to be used for the input AD conversion are individually set according to the use applications thereof and then the common AD-conversion-timing generation device to be used for the charge/discharge AD conversion is used. This can reduce the number of the timer triggers to be used.

This technical idea will be generalized as follows. That is, the AD conversion circuit 45 performs the charge/discharge AD conversion on the input signals input to the one or more signal input terminals included in the first group and on the input signals input to the one or more signal input terminals included in the second group with the timings generated using the common AD conversion trigger. The charge/discharge AD conversion need not necessarily be performed on the input signals input to all the signal input terminals in each of the groups.

Figure 6:
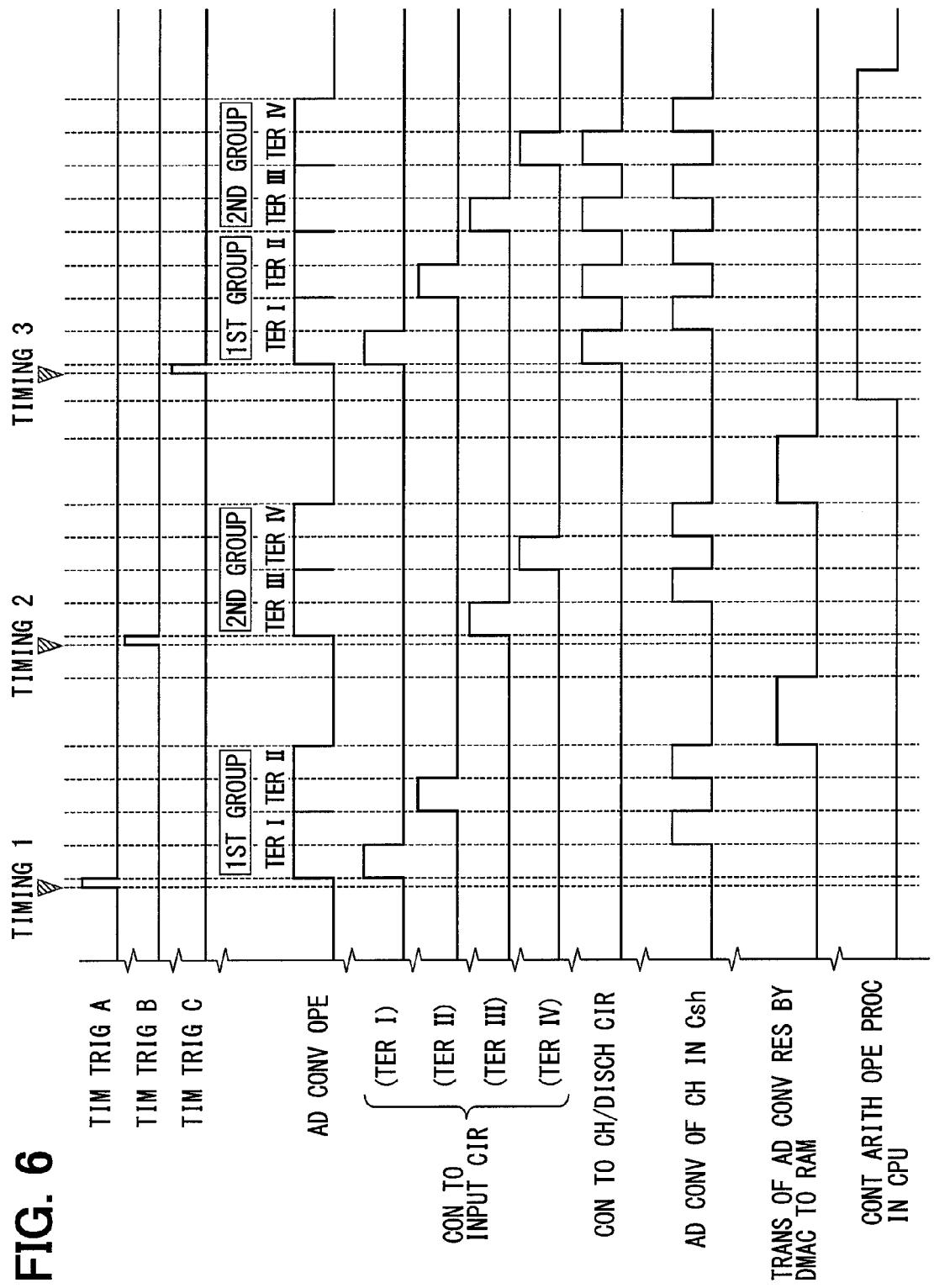
FIG. 6 is a time chart showing Operation Example 3 of the signal control device in the first embodiment.

FIG. 6 shows "Operation Example 3" using the configuration in Table 2.

In FIG. 6, not only Timings 1, 2, and 3 for three Timer Triggers A, B, and C, but also the same individual timings as in FIGS. 4 and 5 are shown. However, the timing of connection to the input circuit 15 is shown for each of the signal input terminals i to iv.

At Timing 1 generated using the timer trigger A and thereafter, the input signals input to the individual signal input terminals i and ii in the first group are successively subjected to the input AD conversion. At Timing 2 generated using the timer trigger B and thereafter, the input signals input to the individual signal input terminals iii and iv in the second group are successively subjected to the input AD conversion. The resulting input AD conversion values are DMA-transferred and then used for the control arithmetic operation in the CPU 301.

At Timing 3 generated using the timer trigger C and thereafter, the four input signals input to the individual signal input terminals i to iv are subjected to the charge/discharge AD conversion in succession. The resulting charge/discharge AD conversion values are not DMA-transferred.

Figure 7:
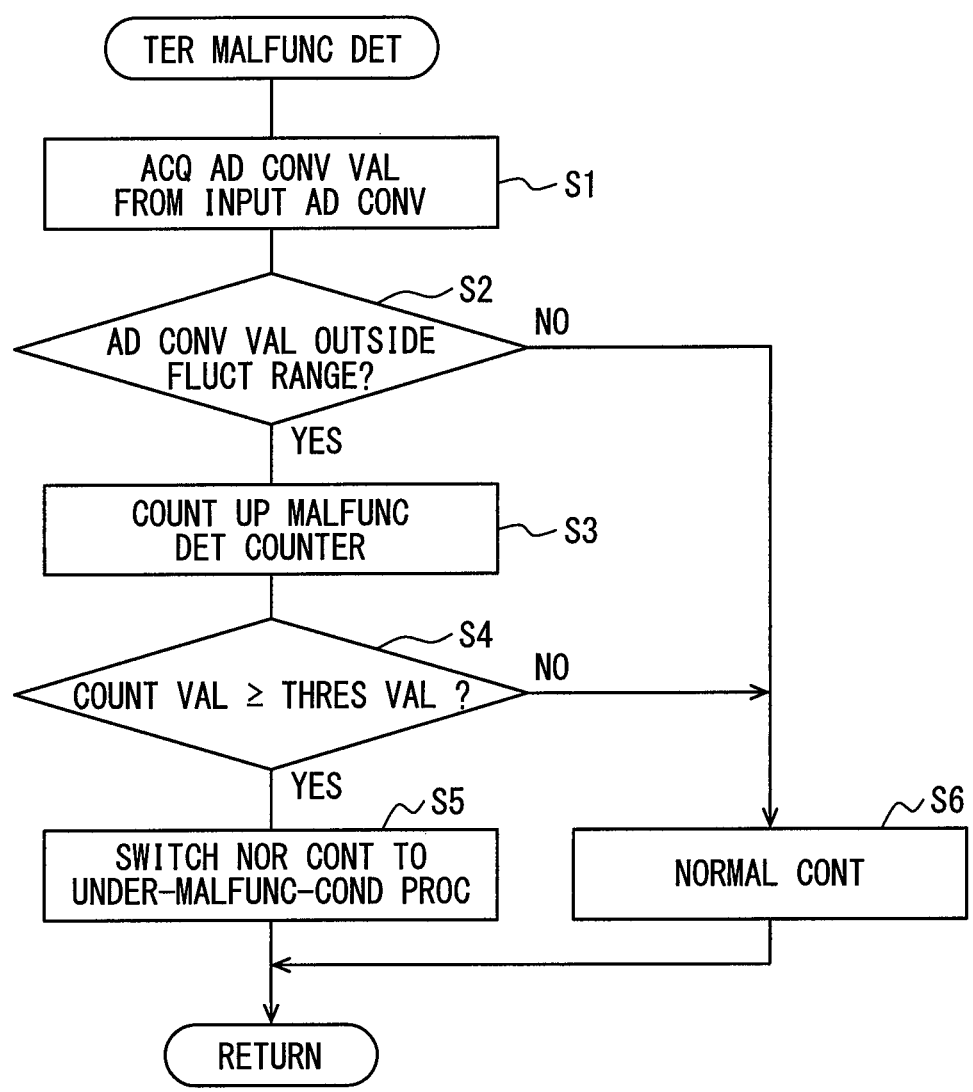
FIG. 7 is a flow chart of a terminal malfunction determination process by the signal control device in the first embodiment.

Next, a description will be given of the terminal malfunction determination process by the malfunction determination section 32 with reference to the flow chart in FIG. 7. In the following description of the flow chart, the symbol "S" means a step. This process routine is repeatedly performed during the operation of the microcomputer 201.

In S1, the malfunction determination section 32 acquires the AD conversion value resulting from the input AD conversion. In S2, the malfunction determination section 32 determines whether or not the acquired AD conversion value is outside the predetermined fluctuation range. When the AD conversion value is within the predetermined fluctuation range, i.e., when NO is given in S2, a malfunction signal Sf is not transmitted and the control arithmetic operation section 31 performs normal control in S6.

When the AD conversion value is outside the fluctuation range, i.e., when YES is given in S2, the malfunction determination section 32 counts up the count value of the malfunction determination counter 321 in S3. Then, in S4, the malfunction determination section 32 determines whether or not the count value is not less than the threshold value. When the count value is not less than the threshold value, i.e., when YES is given in S4, the malfunction determination section 32 determines that a terminal malfunction has occurred and transmits the malfunction signal Sf to the control arithmetic operation section 31. As a result, the control arithmetic operation section 31 switches the normal control to the under-malfunction-condition procedure in S5.

On the other hand, when the count value is less than the threshold value and NO is given in S4, the malfunction signal Sf is not transmitted and the control operation arithmetic operation section 31 performs the normal control in S6.

As the "under-malfunction-condition procedure" performed by the control arithmetic operation section 31, the normal control may also be switched to, e.g., open control which does not use the input signal. In a system redundantly including a plurality of sensors each of which detects the same physical quantity, when a terminal malfunction occurs in association with the input signal from any of the sensors, the normal control may also be switched to a control arithmetic operation which uses only the input signal acquired via a normal terminal and a normal transmission path. Depending on the system, when it is determined that there is a terminal malfunction, the operation thereof may also be halted.

(Effects)

Thus, in the present embodiment, the input circuit 15 and the sampling capacitor Csh are connected upon each AD conversion, which is either the charge/discharge AD conversion and the input AD conversion. On the other hand, the charge/discharge circuit 42 and the sampling capacitor Csh are connected upon the charge/discharge AD conversion and are not connected upon the input AD conversion.

That is, in the operation in the present embodiment, it is sufficient to merely switch the charge/discharge circuit 42 and the sampling capacitor Csh between the connected state and the disconnected state upon each AD conversion in a state where conduction is provided between the input circuit 15 and the sampling capacitor Csh. In other words, the operation of shifting the timing of connecting the input circuit 15 and the sampling capacitor Csh from the timing of connecting the charge/discharge circuit 42 and the sampling capacitor Csh is unnecessary. Therefore, a terminal malfunction can be detected using a simple and easy switching operation.

Also, the control arithmetic operation section 31 in the present embodiment uses only the AD conversion value resulting from the input AD conversion for a control arithmetic operation and does not use only the AD conversion value resulting from the charge/discharge AD conversion. This allows a control arithmetic operation using a correct AD conversion value to be performed.

Accordingly, the present embodiment is particularly effective in a system in which an extremely small error in input value affects steering feeling such as the electric power steering system 90 of a vehicle.

Second Embodiment

Figure 8:
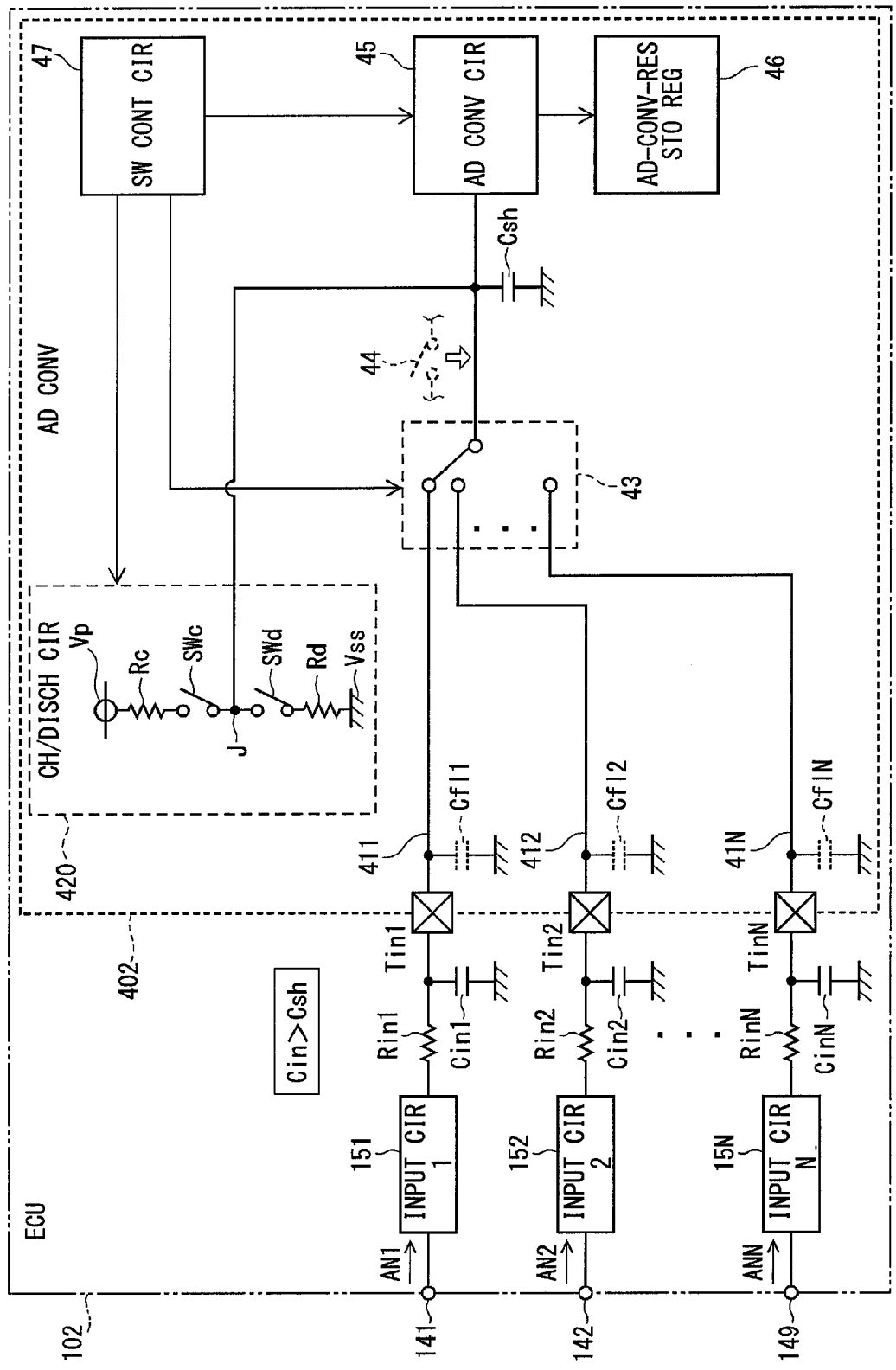
FIG. 8 is a configuration diagram of an AD converter in the signal control device in the second embodiment.

Next, referring to FIG. 8, a description will be given of a configuration of a second embodiment. An overall configuration of the ECU 102 and the microcomputer 202 is the same as in FIG. 2 in the first embodiment.

The second embodiment is different from the first embodiment in a configuration of a charge/discharge circuit 420 in the AD converter 402. Specifically, the charge/discharge circuit 420 is provided commonly to the plurality of signal input terminals Tin on the side of the analog multiplexer 43 which is closer to the sampling capacitor Csh. The charge/discharge circuit 420 and the sampling capacitor Csh are switched between a connected state and a disconnected state upon each AD conversion in a state where conduction is provided between the input circuit 15 and the sampling capacitor Csh.

When the charge switch SWc and the discharge switch SWd of the charge/discharge circuit 420 are connected, the sampling capacitor Csh can be charged or discharged.

Unless a disconnection failure has occurred in the transmission path 41, when the charge switch SWc and the discharge switch SWd are connected, the floating capacitance Cfl is also charged or discharged via the analog multiplexer 43.

Unless an open failure has occurred at the signal input terminal Tin, when the charge switch SWc and the discharge switch SWd are connected, the input capacitance Cin is also charged or discharged.

As a comparative example, a device is assumed in which charging/discharging is performed only when the input circuit 15 and the sampling capacitor Csh are in a nonconductive state. The device in the comparative example needs to have the following configuration in which:

(a) the charge/discharge circuit is provided for each of the plurality of signal input terminals Tin1, Tint, . . . , and TiN in one-to-one correspondence;

(b) besides the multiplexer for selecting the signal input terminal, a multiplexer for the charge/discharge circuits is provided; and (c) an analog multiplexer having a full power-OFF mode in which the sampling capacitor Csh is connected to none of the terminals is used. Alternatively, in the case of using an analog multiplexer which does not have the full power-OFF mode, a cutoff switch 44 is provided between the multiplexer for selecting the signal input terminal and the sampling capacitor Csh, as shown by the broken line.

In contrast to this comparative example, it is sufficient in the second embodiment to control only the presence or absence of connection of the charge switch SWc or the discharge switch SWd of the charge/discharge circuit 420 and no additional circuit is required. While the plurality of charge/discharge circuits 421 to 42N are provided respectively for the plurality of signal input terminals Ti1, Ti2, . . . , and TiN in one-to-one correspondence in the first embodiment, the one charge/discharge circuit 420 is provided commonly to the plurality of signal input terminals Tin1, Tin2, . . . , and TiN in the second embodiment. This allows the configuration of the AD converter 402 to be simplified.

Third Embodiment

Figure 9:
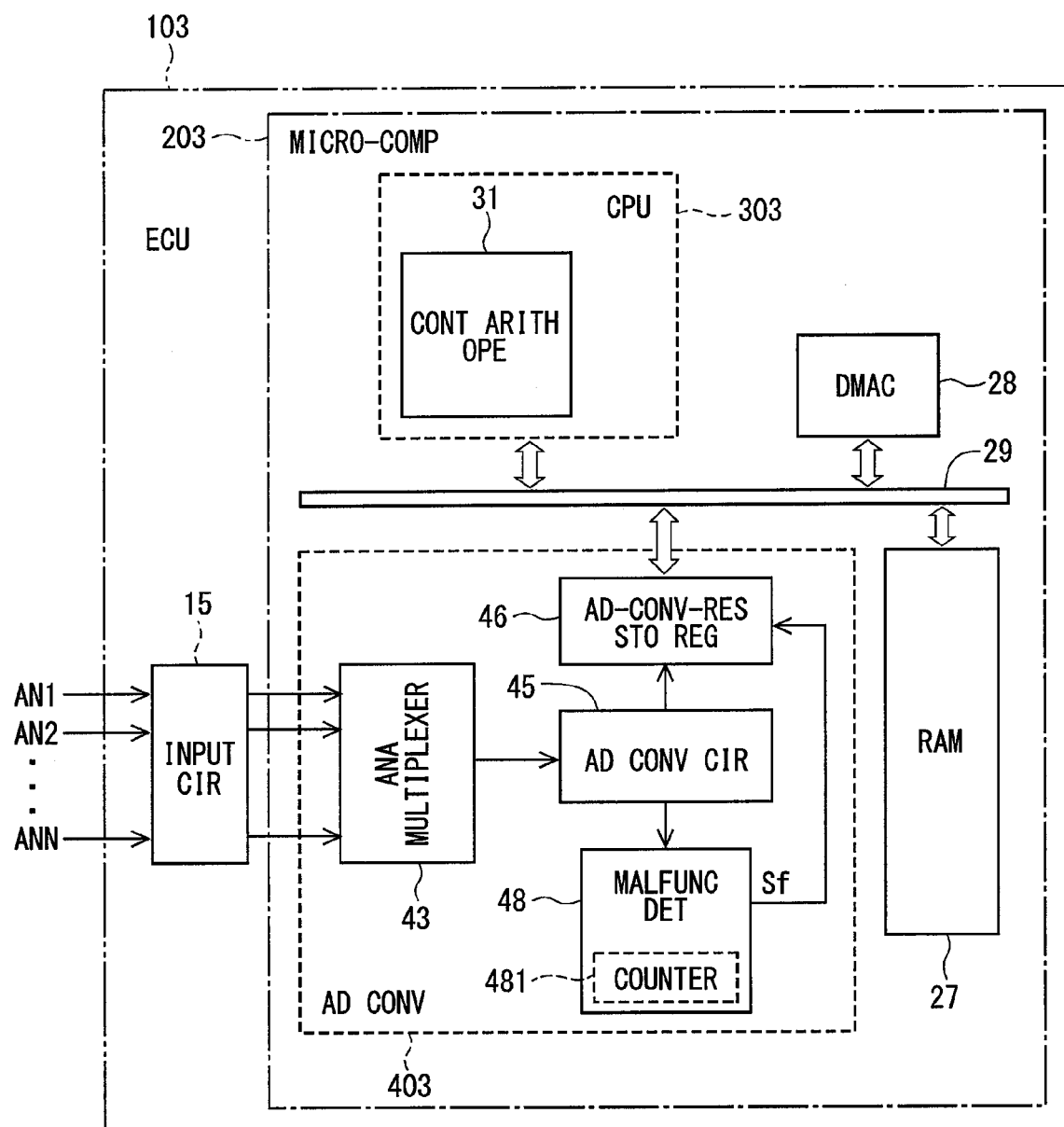
FIG. 9 is a configuration diagram of the signal control device in the third embodiment.

Referring next to FIG. 9, a description will be given of a configuration of a third embodiment.

An ECU 103 in the third embodiment has a malfunction determination section 48 provided in an AD converter 403 of a microcomputer 203. An AD conversion value resulting from the input AD conversion in the AD conversion circuit 45 is acquired from the AD-conversion-result storage register 46 by the control arithmetic operation section 31 of a CPU 303 via the bus 29 and acquired by the malfunction determination section 48 in the AD converter 403 and used for malfunction determination. Note that the malfunction determination section 48 in this configuration may also acquire AD conversion values resulting from both the input AD conversion and the charge/discharge AD conversion.

The malfunction determination section 48 has the malfunction determination counter 481, similarly to the malfunction determination section 32 in the first embodiment and determines that there is a terminal malfunction when the count value of the malfunction determination counter 481 exceeds a predetermined threshold value. When it is determined that there is a terminal malfunction, the malfunction signal Sf is acquired by the control arithmetic operation section 31 from, e.g., the AD-conversion-result storage register 46 via the bus 29. Then, as shown in S5 in the flow chart in FIG. 7, the control arithmetic operation section 31 switches the normal control to the under-malfunction-condition procedure.

Thus, even in the configuration in which the malfunction determination section 48 is provided in the AD converter 403, the same function/effect as achieved in each of the first and second embodiments is achieved.

Other Embodiments (1) In the foregoing embodiments, the DMA transfer of the AD conversion value need not necessarily be performed by the DMAC 28. That is, it may also be possible that, unlike in the configuration in FIG. 2, the DMAC 28 is not provided in the microcomputer 201 and the CPU 301 acquires the AD conversion value used by the control arithmetic operation section 31 for the control arithmetic operation and the AD conversion value used by the malfunction determination section 32 for malfunction determination directly from the AD converter 101. Alternatively, it may also be possible that, unlike in the configuration in FIG. 9, the DMAC 28 is not provided in the microcomputer 203 and the CPU 303 acquires the AD conversion value used by the control arithmetic operation section 31 for a control arithmetic operation directly from the AD converter 103.

In the configuration including the DMAC 28, not only the input AD conversion value, but also the charge/discharge AD conversion value may also be DMC-transferred.

(2) In the foregoing embodiments, to the AD converter 40, the plurality of input signals AN1, AN2, . . . , and ANN are input and any selected one of the signal input terminals Tin1, Tin2, . . . , and TinN and the sampling capacitor Csh are connected using the analog multiplexer 43.

Otherwise, an AD converter in which the one type of input signal AN is input to the one signal input terminal Tin may also include the configuration of the present disclosure. In that case, the analog multiplexer 43 is no longer necessary and it is sufficient for the switch control circuit 47 to switch only the charge switch SWc and the discharge switch SWd of the charge/discharge circuit 42. As a result, the configuration is further simplified.

(3) An electric power steering system to which a signal control device of the present disclosure is applied is not limited to an electric power steering system which drives a 3-phase ac brushless motor using an inverter and may also be an electric power steering system which drives a DC motor using a H-bridge circuit. Also, the signal control device of the present disclosure may be applied not only to an electric power steering system, but also to any device which AD-converts an input signal and performs a control arithmetic operation.

It is noted that a flowchart or the processing of the flowchart in the present application includes sections (also referred to as steps), each of which is represented, for instance, as Si. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A signal control device comprising:
   at least one signal input terminal to which an input signal with a voltage fluctuating within a predetermined fluctuation range is input from an input circuit;
   a sampling capacitor having one end connected to the at least one signal input terminal and an other end connected to a reference potential;
   a charge or discharge circuit having a charge or discharge switch which switches electrical connection and electrical disconnection between the charge or discharge circuit and the sampling capacitor, and charges or discharges the sampling capacitor when the charge or discharge circuit and the sampling capacitor are connected to each other;
   an AD conversion circuit that converts an analog value of a voltage charged in the sampling capacitor to an AD conversion value;
   a switch control circuit that controls the charge or discharge switch, and adjusts a timing of AD conversion in the AD converter circuit when the charge or discharge switch switches the connection and disconnection;
   a control arithmetic operation device that performs a predetermined control arithmetic operation using at least a part of the AD conversion value in a result of the AD conversion of the AD conversion circuit; and
   a malfunction determination device that acquires the at least the part of the AD conversion value in the result of the AD conversion of the AD conversion circuit, and determines a terminal malfunction that the at least one signal input terminal or a transmission path of the input signal to be input into the at least one signal input terminal malfunctions when the at least the part of the AD conversion value is not within the predetermined fluctuation range, wherein:
   the AD conversion circuit performs a charge or discharge AD conversion in which the voltage charged in the sampling capacitor, in a state where the charge or discharge circuit and the sampling capacitor are electrically connected, and the input signal is input into the sampling capacitor via the at least one signal input terminal, is converted to an AD conversion value;
   the AD conversion circuit performs an input AD conversion in which the voltage charged in the sampling capacitor, in a state where the charge or discharge circuit and the sampling capacitor are electrically disconnected, but the input signal is input into the sampling capacitor via the at least one signal input terminal, is converted to an AD conversion value; and
   the AD conversion circuit performs the charge or discharge AD conversion at a timing different from the input AD conversion.

2. The signal control device according to claim 1, wherein:
   the control arithmetic operation device performs the predetermined control arithmetic operation using only the AD conversion value resulting from the input AD conversion.

3. The signal control device according to claim 1, wherein:
   the malfunction determination device determines the terminal malfunction using only the AD conversion value resulting from the input AD conversion.

4. The signal control device according to claim 1, wherein:
   the malfunction determination device together with the control arithmetic operation device are arranged in a CPU.

5. The signal control device according to claim 1, further comprising:
   a RAM that stores the AD conversion value; and
   a DMAC that DMA-transfers, to the RAM, at least the AD conversion value resulting from the input AD conversion.

6. The signal control device according to claim 1, wherein:
   a numerical number of times that the AD conversion circuit performs the input AD conversion within a predetermined time is different from a numerical number of times that the AD conversion circuit performs the charge or discharge AD conversion within the predetermined time.

7. The signal control device according to claim 1, further comprising:
   an input-side capacitor arranged between the at least one signal input terminal and the reference potential on an input circuit side from the sampling capacitor.

8. The signal control device according to claim 7, wherein:
   a capacitance of the input-side capacitor is larger than a capacitance of the sampling capacitor.

9. The signal control device according to claim 7, wherein:
   the charge or discharge circuit charges or discharges the input-side capacitor in addition to the sampling capacitor.

10. The signal control device according to claim 1, further comprising:
an analog multiplexer, wherein:
the at least one signal input terminal includes a plurality of signal input terminals; and
the analog multiplexer selects one of the plurality of signal input terminals; and
the analog multiplexer connects the one of the plurality of signal input terminals to the sampling capacitor.

11. The signal control device according to claim 10, wherein:
the charge or discharge circuit is arranged on a sampling capacitor side from the analog multiplexer;
the charge or discharge circuit charges or discharges an input-side capacitor or a floating capacitance in addition to the sampling capacitor via the analog multiplexer;
the input-side capacitor is arranged between the at least one signal input terminal and the reference potential on an input circuit side from the analog multiplexer; and
the floating capacitance is generated between the at least one signal input terminal and the reference potential.

12. The signal control device according to claim 1, wherein:
the at least one signal input terminal includes a plurality of signal input terminals;
a part of the plurality of signal input terminals is defined as a first group;
the AD conversion circuit performs the input AD conversion with respect to each signal input terminal in the first group at a same first AD conversion trigger;
another part of the plurality of signal input terminals is defined as a second group;
the second group includes at least one signal input terminal which is different from the first group;
the AD conversion circuit performs the input AD conversion with respect to each signal input terminal in the second group at a same second AD conversion trigger;
the first AD conversion trigger is different from the second AD conversion trigger;
the AD conversion circuit performs the charge or discharge AD conversion with respect to each signal input terminal in the first group and each signal input terminal in the second group at a same third AD conversion trigger.

13. The signal control device according to claim 1, wherein:
the malfunction determination device has a malfunction determination counter which counts a numerical number of times that the malfunction determination device determines that the at least the part of the AD conversion value is not within the predetermined fluctuation range; and
the malfunction determination device determines that the terminal malfunction occurs when a count value of the malfunction determination counter is not less than a predetermined threshold value.

14. The signal control device according to claim 1, wherein:
when the malfunction determination device determines that the terminal malfunction occurs, the control arithmetic operation device switches from normal operation control to an under-malfunction-condition operation control different from the normal operation control, and performs the predetermined control arithmetic operation.

15. The signal control device according to claim 1, wherein:
the signal control device is applied to an electric power steering system which assists a steering torque of a driver with an output torque of an assist motor;
the input signal to be input into the at least one signal input terminal via the transmission path includes a steering torque signal and a feedback signal when the at least one signal input terminal and the transmission path are normal; and
the feedback signal is used to control the output torque of the assist motor.

* * * * *